(12) United States Patent  (10) Patent No.: US 8,654,313 B2
Takahashi et al.  (45) Date of Patent: Feb. 18, 2014

(54) EXPOSING METHOD AND METHOD OF MANUFACTURING SEMICONDUCTOR DEVICE

(75) Inventors: Masanori Takahashi, Kanagawa (JP); Takashi Sato, Kanagawa (JP); Satoshi Tanaka, Kanagawa (JP); Soichi Inoue, Kanagawa (JP); Takamasa Takaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 484 days.

(21) Appl. No.: 12/952,835

(22) Filed: Nov. 23, 2010

(65) Prior Publication Data

US 2011/0122390 A1 May 26, 2011

(30) Foreign Application Priority Data

Nov. 26, 2009 (JP) ................................ 2009-268570

(51) Int. Cl.
*G03B 27/32* (2006.01)
*G03B 27/54* (2006.01)
*G03B 27/72* (2006.01)
*G03B 27/52* (2006.01)

(52) U.S. Cl.
USPC .................... 355/77; 355/55; 355/67; 355/71

(58) Field of Classification Search
USPC ........ 355/52, 53, 55, 67–71, 72, 77; 430/5, 8, 430/22, 30, 311, 312, 313, 321, 394; 250/492.1, 492.2, 492.22, 548
See application file for complete search history.

(56) References Cited

U.S. PATENT DOCUMENTS

| 4,082,453 | A | * | 4/1978 | Knop ............................. 355/88 |
| 5,300,971 | A | * | 4/1994 | Kudo ............................. 355/67 |
| 5,305,054 | A | * | 4/1994 | Suzuki et al. .................. 355/53 |
| 5,367,404 | A | * | 11/1994 | Hayata .......................... 359/558 |
| 5,480,047 | A | * | 1/1996 | Tanigawa et al. ................ 430/5 |
| 5,621,497 | A | * | 4/1997 | Terasawa et al. ............... 355/53 |
| 5,691,541 | A | * | 11/1997 | Ceglio et al. ............... 250/492.1 |
| 6,855,486 | B1 | * | 2/2005 | Finders et al. ................ 430/394 |
| 6,930,754 | B1 | * | 8/2005 | Sugita et al. ................... 355/53 |
| 7,426,711 | B2 | | 9/2008 | Fujisawa et al. |
| 7,709,187 | B2 | | 5/2010 | Patel et al. |

(Continued)

FOREIGN PATENT DOCUMENTS

| JP | 5-47623 | 2/1993 |
| JP | 6-112119 | 4/1994 |

(Continued)

OTHER PUBLICATIONS

Notice of Rejection mailed by the Japanese Patent Office on Apr. 16, 2013, in Japanese patent application No. 2009-268570.

*Primary Examiner* — Toan Ton
*Assistant Examiner* — Christina Riddle
(74) *Attorney, Agent, or Firm* — Finnegan, Henderson, Farabow, Garrett & Dunner, L.L.P.

(57) ABSTRACT

According to one embodiment, on a substrate, a resist layer is laminated on an upper side of a pattern formation layer on which a desired pattern is formed. A diffraction pattern that diffracts exposure light irradiated on the substrate is formed further on the upper side than the resist layer. Overall exposure is performed from above the diffraction pattern using a deformed light having illumination light source shape determined according to the desired pattern. Diffracted light diffracted on the diffraction pattern by the exposure is irradiated on the resist layer.

2 Claims, 10 Drawing Sheets

(56) References Cited

U.S. PATENT DOCUMENTS

| | | |
|---|---|---|
| 7,799,517 B1 * | 9/2010 | Capodieci .................. 430/396 |
| 7,847,918 B2 | 12/2010 | Yamamoto |
| 2005/0151949 A1 * | 7/2005 | Eib et al. .................... 355/67 |
| 2006/0055834 A1 * | 3/2006 | Tanitsu et al. ................ 349/5 |
| 2006/0192935 A1 * | 8/2006 | Hansen et al. ............... 355/69 |
| 2007/0195295 A1 * | 8/2007 | Fujisawa et al. ............. 355/53 |
| 2007/0258077 A1 | 11/2007 | Tanaka et al. |
| 2008/0145793 A1 * | 6/2008 | Patel et al. .................. 430/311 |
| 2008/0160423 A1 * | 7/2008 | Chen et al. .................... 430/5 |
| 2009/0053618 A1 * | 2/2009 | Goehnermeier ............... 430/5 |
| 2009/0117494 A1 * | 5/2009 | Owa ........................... 430/322 |

FOREIGN PATENT DOCUMENTS

| | | |
|---|---|---|
| JP | 6-132216 | 5/1994 |
| JP | 10-125582 | 5/1998 |
| JP | 2000-77317 | 3/2000 |
| JP | 2005-19930 | 1/2005 |
| JP | 2006-227514 | 8/2006 |
| JP | 2008-41710 | 2/2008 |
| WO | WO 2007/119514 | 10/2007 |
| WO | WO 2008/049844 | 5/2008 |

* cited by examiner

EXPOSING METHOD AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2009-268570, filed on Nov. 26, 2009; the entire contents of which are incorporated herein by reference.

FIELD

Embodiments described herein relate generally to an exposing method, a method of manufacturing a semiconductor device, and an exposure apparatus.

BACKGROUND

In a lithography process in manufacturing a semiconductor device, to form a fine pattern, a mask (a reticle) having size four times as large as that of a pattern to be actually formed and an exposure apparatus including a reduction projection optical system are used.

However, in recent years, according to the microminiaturization of patterns, it is becoming difficult to form a mask pattern even if the quadruple-sized mask is used. Because of design of an optical system and physical limitations of members, a reduction in the size of a pattern that can be formed on a wafer is near a limit. As resolution enhancement techniques against such problems, new exposure techniques such as double patterning are proposed. It is not easy to adopt the double patterning because there are a large number of problems such as a shift that occurs when first exposure and second exposure are superimposed. Therefore, there is a demand for a technique that can easily form various fine patterns.

DETAILED DESCRIPTION

In general, according to one embodiment, on a substrate, a resist layer is laminated on the upper side of a pattern formation layer on which a desired pattern is formed. A diffraction pattern that diffracts exposure light irradiated on the substrate is formed further on the upper side than the resist layer. Overall exposure is performed from above the diffraction pattern using a deformed light having illumination light source shape determined according to the desired pattern. Diffracted light diffracted on the diffraction pattern by the exposure is irradiated on the resist layer.

Exemplary embodiments of an exposing method, a method of manufacturing a semiconductor device, and an exposure apparatus will be explained below in detail with reference to the accompanying drawings. The present invention is not limited to the following embodiments.

In a first embodiment, diffraction patterns that diffract exposure light are formed in advance further on the upper side than a layer (a pattern formation layer) on which desired pattern formation is performed. Overall exposure is performed from above the diffraction patterns. When the overall exposure is performed, the exposure light is irradiated on a wafer at an irradiation angle (in the illumination light source shape of a deformed light) corresponding to pattern shape desired to be formed on the wafer. Consequently, various patterns having desired dimensions finer than the upper diffraction patterns are formed.

Figure 1:
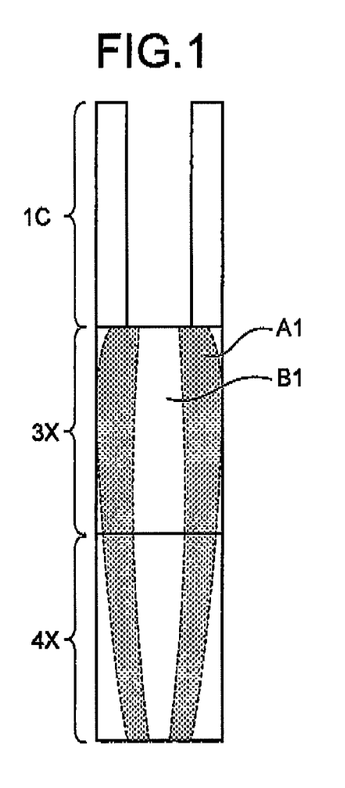
FIG. 1 is a sectional view of diffraction patterns and the structure of a resist layer.

FIG. 1 is a sectional view of diffraction patterns and the configuration of a resist layer. A pattern formation layer 4X on which pattern formation is performed is laminated on a substrate (not shown) such as a wafer. A resist layer 3X is laminated on the pattern formation layer 4X. Diffraction patterns (initial patterns) 1C functioning as a diffraction grating are formed above the resist layer 3X.

In this embodiment, when desired patterns are formed on the pattern formation layer 4X, the overall exposure is performed from the upper side of the diffraction patterns 1C. A photomask or the like is unnecessary because the overall exposure is performed. Light for exposure is irradiated on the substrate (the upper side of the diffraction patterns 1C) without the intervention of the photomask.

The overall exposure needs to be performed under conditions for occurrence of a diffraction phenomenon. The conditions for occurrence of the diffraction phenomenon are, for example, a pitch p of the diffraction patterns 1C is larger than (wavelength $\lambda$ of exposure light in the overall exposure)/(a refractive index n of diffraction patterns with respect to the exposure light in the overall exposure) ($p > \lambda/n$). For example, when EUV light is used for the overall exposure, the refractive index n can be assumed to be about 1. Therefore, exposure light having wavelength smaller than a dimension of a pitch of the diffraction patterns 1C is used.

A minimum pattern pitch of the diffraction patterns 1C depends on the wavelength of exposure light used in forming the diffraction patterns 1C. Therefore, as exposure light used in the overall exposure, it is desirable to use exposure light having wavelength smaller than the wavelength of the exposure light used in forming the diffraction patterns 1C. For example, when an i-line (wavelength 365 nanometers) is used in forming the diffraction patterns 1C, the overall exposure is performed by using a KrF excimer laser (wavelength 248 nanometers), an ArF excimer laser (wavelength 193 nanometers), an F2 excimer laser (wavelength 157 nanometers), extreme ultraviolet lithography (EUV) (wavelength 13.6 nanometers), or the like having wavelength smaller than that of the i-line. Immersion exposure or an electron beam can also be used for the formation and the overall exposure of the diffraction patterns 1C. In the explanation of this embodiment, the diffraction patterns 1C are formed by using the ArF excimer laser and the overall exposure is performed by using the EUV.

When the overall exposure is performed from above the diffraction patterns 1C, aerial image intensity distribution (a light intensity distribution of an optical image) to be focused appears in films of the resist layer 3X and the pattern formation layer 4X. In FIG. 1, an area where the light intensity is low is represented as low-intensity area A1 and an area where the light intensity is high is represented as a high-intensity area B1. The low-intensity area A1 is an area where the light intensity distribution is weak because of the diffraction of the exposure light by the diffraction patterns 1C. The high-intensity area B1 is an area where the light intensity distribution is strong because of the diffraction of the exposure light by the diffraction patterns 1C.

Of the resist layer 3X and the pattern formation layer 4X, resist patterns are formed on the resist layer 3X by development processing after the exposure. When the resist layer 3X is a positive resist, the resist patterns are left in the low-intensity area A1 of the resist layer 3X by the development processing after the exposure. The resist patterns are removed from the high-intensity area B1 of the resist layer 3X by the development processing after the exposure. Specifically, the high-intensity area B1 is a pattern formation area for line patterns or the like and the low-intensity area A1 is a space area. After the resist layer 3X is subjected to the development processing, the pattern formation layer 4X is etched with the resist layer 3X after the development as a mask, whereby desired patterns are formed on the pattern formation layer 4X.

FIGS. 2A to 2I are diagrams for explaining a procedure of processing for forming patterns on a pattern formation layer. In FIGS. 2A to 2I, a section of a substrate is shown.

Figure 2A:
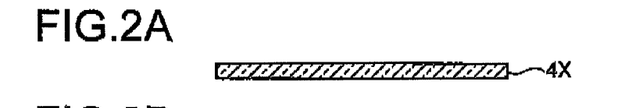
FIGS. 2A to 2I are diagrams for explaining a procedure of processing for forming patterns on a pattern formation layer.
Figure 2B:
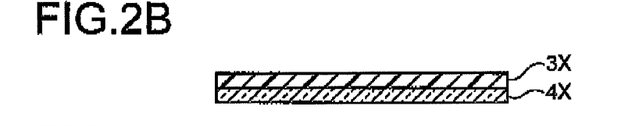

As shown in FIG. 2A, a substrate (the pattern formation layer 4X) is prepared. As shown in FIG. 2B, the first resist layer 3X is laminated on the pattern formation layer 4X. The first resist layer 3X is a resist layer that is subjected to overall exposure later. The pattern formation layer 4X is not limited to a semiconductor substrate and can be any layer such as a metal layer or an insulated layer.

Figure 2C:
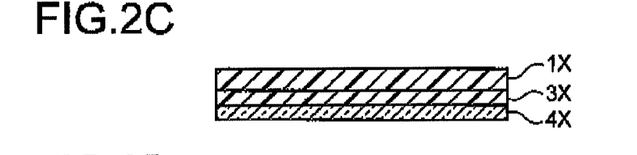

After the resist layer 3X is laminated on the pattern formation layer 4X, as shown in FIG. 2C, a second resist layer 1X is laminated on the resist layer 3X. The second resist layer 1X is a resist layer that is used in formation of the diffraction patterns 1C.

Figure 2D:
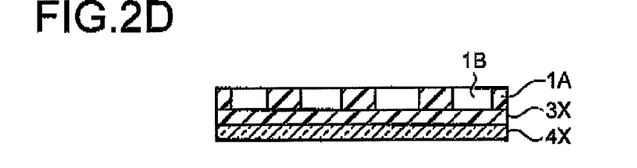

After the second resist layer 1X is laminated on the resist layer 3X, as shown in FIG. 2D, exposure (e.g., exposure by an ArF excimer laser) on the second resist layer 1X is performed. The exposure on the second resist layer 1X is exposure performed by using a photomask and a projection optical system. Consequently, on the second resist layer 1X, positions corresponding to light blocking units of the photomask (patterns 1A) are not exposed and positions in light transmitting sections (patterns 1B) are exposed.

Figure 2E:
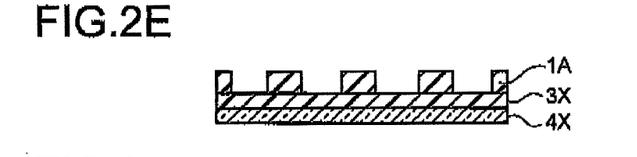
Figure 2F:
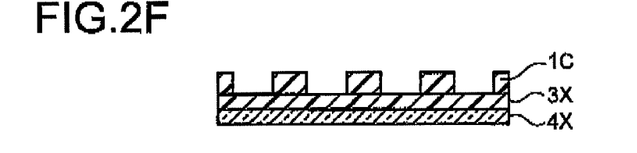

After the second resist layer 1X is exposed, as shown in FIG. 2E, development is performed and, as shown in FIG. 2F, post exposure bake (PEB) is performed. Only the patterns 1A are left and the patterns 1B are removed by the development. The patterns 1A are hardened and changed to the diffraction patterns 1C by the PEB. The diffraction patterns 1C can be resist patterns after the development or can be a mask material etched by using the resist patterns after the development (post-etching patterns). The diffraction patterns 1C can be patterns formed by nano-imprint or can be patterns formed by using a sidewall process.

Figure 2G:
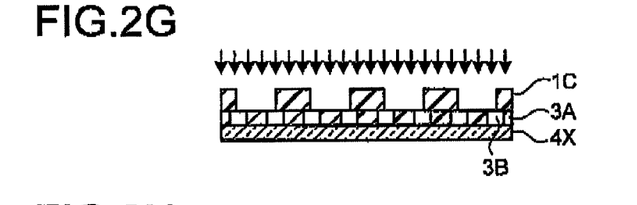

Thereafter, as shown in FIG. 2G, the overall exposure is performed from the upper surface side the diffraction patterns 1C. The overall exposure (e.g., overall exposure by the EUV) is performed by exposure light having wavelength smaller than wavelength used in exposing the second resist layer 1X. Consequently, on the first resist layer 3X, predetermined positions corresponding to the diffraction patterns 1C (positions of resist patterns 3A explained later) are not exposed and positions other than the resist patterns 3A (patterns to be removed 3B) are exposed.

Figure 2H:
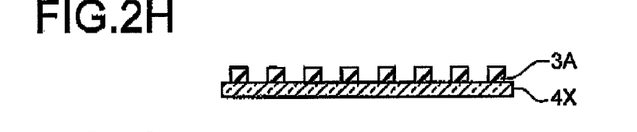
Figure 2I:
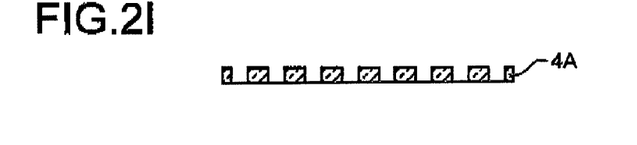

After the overall exposure is performed from the upper surface side the diffraction patterns 1C, removal of the diffraction patterns 1C is performed. Further, development and FEB are performed. Consequently, as shown in FIG. 2H, only the resist patterns 3A are left and the patterns to be removed 3B are removed. Thereafter, etching of the pattern formation layer 4X is performed with the resist patterns 3A after the development as a mask. As shown in FIG. 2I, desired patterns (post-etching patterns 4A) are formed.

An intermediate layer can be laminated between the resist layer 3X and the resist layer 1X. The intermediate layer is a film for controlling (adjusting) a distance between the resist layer 3X and the diffraction patterns 1C. When the intermediate layer is laminated between the resist layer 3X and the resist layer 1X, after the overall exposure on the diffraction patterns 1C is performed, removal of the diffraction patterns 1C and the intermediate layer is performed.

A light intensity distribution formed in the resist layer 3X is different according to differences of an illuminating device and illumination light source shape used in performing the overall exposure. This is because an irradiation angle of exposure light irradiated on a wafer is different according to a difference of the illumination light source shape used in performing the overall exposure. Therefore, the shape of patterns formed on the wafer is also different according to the difference of the illumination light source shape used in performing the overall exposure.

Therefore, in this embodiment, the illumination light source shape of a deformed light corresponding to pattern shape formed on the wafer is determined. In other words, the light intensity distribution formed in the resist film 3X substantially depends on an illumination light angle distribution of an illumination optical system that irradiates and projects exposure light. Therefore, an illumination angle of exposure light irradiated on the wafer is controlled according to the illumination light source shape, whereby the position of focusing of the exposure light and an image profile such as contract are modulated. Consequently, the resolution of the resist layer 3X is improved to form fine patterns and line ends where pattern formation is difficult with overall exposure performed by only vertical incidence.

The deformed light is a light other than a normal light and is dipole lights 11P to 11X explained later, four-eye lights (C-quad.) 13P to 13S, and orbicular zone lights (Annular) 15P to 15S. The normal light is a light having a single light source passing through the center of the illuminating device.

Figure 3A:
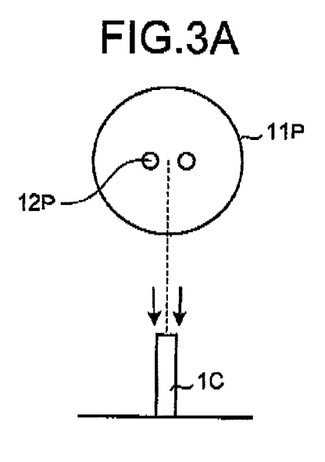
FIGS. 3A and 3B are diagrams for explaining a relation between illumination light source shape and irradiation angles of exposure light.
Figure 3B:
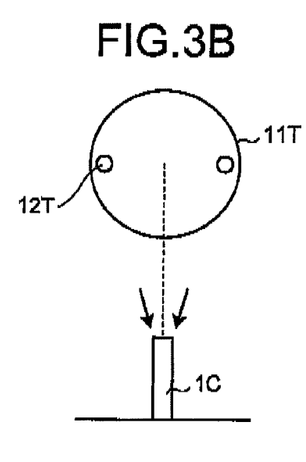

FIGS. 3A and 3B are diagrams for explaining a relation between illumination light source shape and irradiation angles of exposure light. In each of FIGS. 3A and 3B, a relation between a top view of a dipole light and an irradiation angle is shown.

As shown in FIG. 3A, when a space between light sources 12P arranged in the dipole light 11P is narrow, an irradiation angle of exposure light irradiated on the diffraction patterns 1C is small. On the other hand, as shown in FIG. 3B, when a space between light sources 12T arranged in the dipole light 11T is wide, an irradiation angle of exposure light irradiated on the diffraction patterns 1C is large. In other words, in the case of the dipole light, exposure light is irradiated on the diffraction patterns 1C at an irradiation angle corresponding to a space between light sources. Specifically, the irradiation angle of the exposure light irradiated on the diffraction patterns 1C increases as the space between the light sources widens. The irradiation angle of the exposure light irradiated on the diffraction patterns 1C decreases as the space between the light sources narrows.

FIGS. 4A to 4E are diagrams for explaining a relation between illumination light source shape and light intensity distributions formed in the resist layer. In each of FIGS. 4A to 4D, a relation between a light intensity distribution formed in the resist layer 3X and illumination light source shape of a dipole light is shown.

Figure 4A:
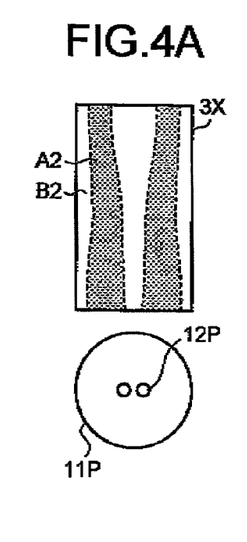
FIGS. 4A to 4E are diagrams for explaining a relation between illumination light source shape and light intensity distributions formed in a resist layer.
Figure 4B:
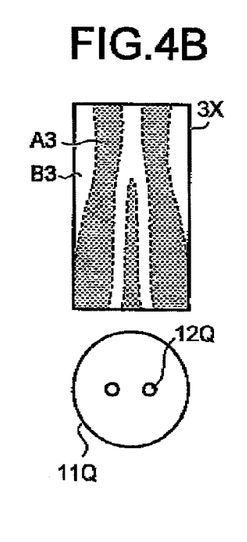

As shown in FIG. 4A, when a space between the light sources 12P arranged in the dipole light 11P is narrow, a low-intensity area A2 and a high-intensity area B2 are formed in the resist layer 3X. As shown in FIG. 4B, when a space between light sources 12Q formed in the dipole light 11Q is set slightly wider than the space between the light sources 12P, a light intensity distribution different from the light intensity distribution formed when the dipole light 11P is used is formed. When the dipole light 11Q is used, a low-intensity area A3 and a high-intensity area B3 are formed in the resist layer 3X. The low-intensity area A3 and the high-intensity area B3 form a light intensity distribution with which, for example, ¼ pitch patterns (patterns formed at a pitch ¼ times as large as the diffraction patterns 1C) can be formed.

Figure 4C:
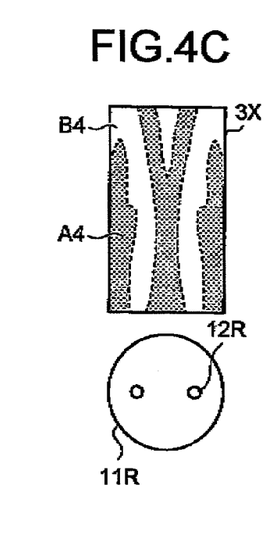

As shown in FIG. 4C, when a space between light sources 12R arranged in the dipole light 11R is set slightly wider than the space between the light sources 12Q, a light intensity distribution different from the light intensity distributions formed when the dipole lights 11P and 11Q are used is formed. When the dipole light 11R is used, a low-intensity area A4 and a high-intensity area B4 are formed in the resist layer 3X.

Figure 4D:
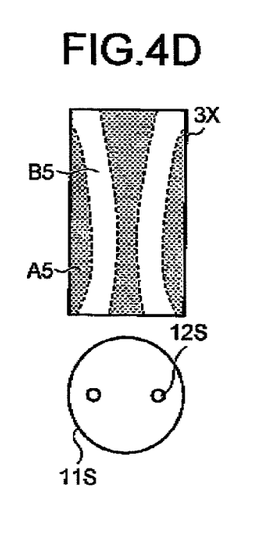

As shown in FIG. 4D, when a space between light sources 12S arranged in the dipole light 11S is set slightly wider than the space between the light sources 12R, a light intensity distribution different from the light intensity distributions formed when the dipole lights 11P to 11R are used is formed. When the dipole light 11S is used, a low-intensity area A5 and a high-intensity area B5 are formed in the resist layer 3X.

Figure 4E:
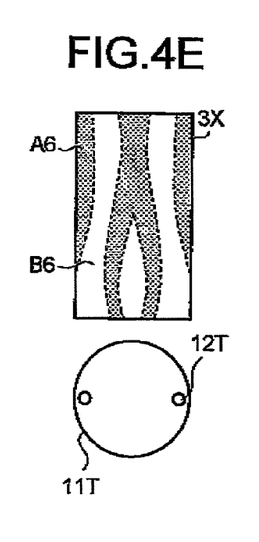

As shown in FIG. 4E, a space between light sources 12T arranged in the dipole light 11T is set slightly wider than the space between the light sources 12S, a light intensity distribution different from the light intensity distributions formed when the dipole lights 11P to 11S are used is formed. When the dipole light 11T is used, a low-intensity area A6 and a high-intensity area B6 are formed in the resist layer 3X. In the low-intensity area A6 and the high-intensity area B6, there are places having a light intensity distribution obtained by reversing (reversing contrasts of), for example, the distributions of the low-intensity area A2 and the high-intensity area B2. In other words, a pattern area formed when the dipole light 11P is used is a space area when the dipole light 11T is used. A space area formed when the dipole light 11P is used is a pattern area when the dipole light 11T is used.

In this way, a light intensity distribution formed in the resist layer 3X is different according to a difference in a space between light sources of a dipole light. Pattern formation can be performed at a desired pitch by adjusting the space between the light sources of the dipole light. Patterns and spaces can be formed in desired positions by adjusting the space between the light sources of the dipole light. Because the patterns and the spaces can be formed in the desired positions in this way, for example, it is possible to form the resist patterns 3A to prevent loop patterns from being formed at line ends when the resist layer 3X is exposed and developed.

Figure 5A:
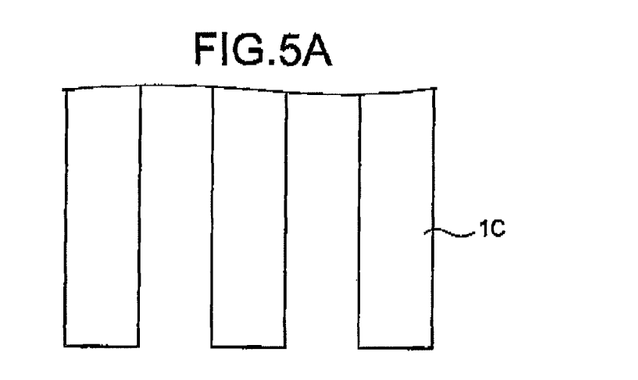
FIGS. 5A to 5C are diagrams for explaining loop patterns at line ends.
Figure 5B:
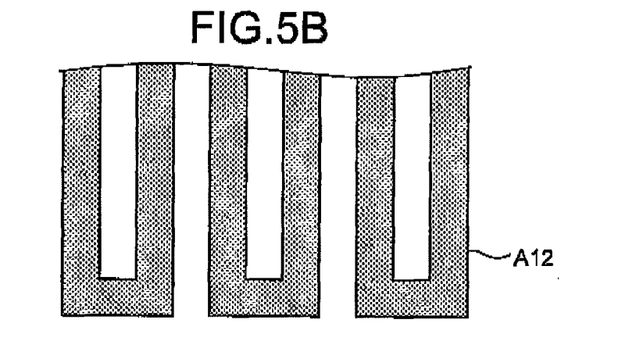
Figure 5C:
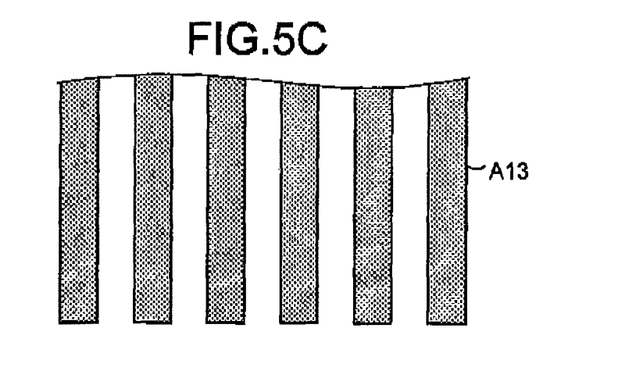

FIGS. 5A to 5C are diagrams for explaining loop patterns at line ends. In FIGS. 5A to 5C, top views of a wafer are shown. In FIG. 5A, the diffraction patterns 1C formed on the wafer are shown. In FIGS. 5B and 5C, resist patterns A12 and A13 formed by using the diffraction patterns 1C are respectively shown.

When the overall exposure for the wafer is performed by using the diffraction patterns 1C without adjusting the shape of an illumination light source, as shown in FIG. 5B, the resist patterns A12 having loop patterns at line ends (edge portions in a longitudinal direction) of patterns are formed.

On the other hand, when the overall exposure of the wafer is performed by using the diffraction patterns 1C after adjusting the shape of the illumination light source, as shown in FIG. 5C, the resist patterns A13 not having loop patterns at line ends of patterns can be formed. In other words, it is possible to form the loop-cut resist patterns A13 by adjusting the shape of the illumination light source.

When the loop patterns are formed, patterning (exposure, development, etc.) for removing the loop patterns is necessary. Therefore, the number of steps for manufacturing a semiconductor device increases. On the other hand, in this embodiment, the resist patterns 13A not having loop patterns can be formed by adjusting the shape of the illumination light source. Therefore, it is possible to reduce the number of steps for manufacturing a semiconductor device.

Figure 6A:
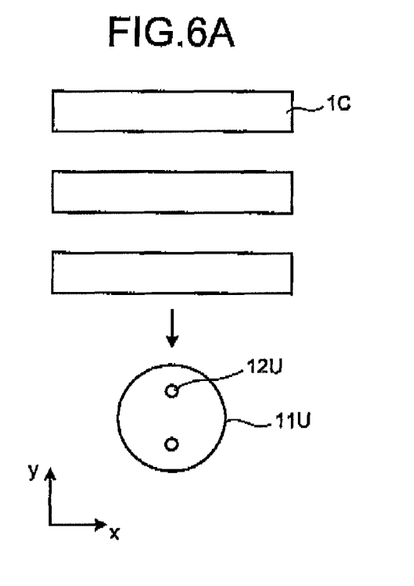
FIGS. 6A and 6B are diagrams for explaining a relation between arrangement directions of light sources and a pattern arrangement direction of the diffraction patterns.
Figure 6B:
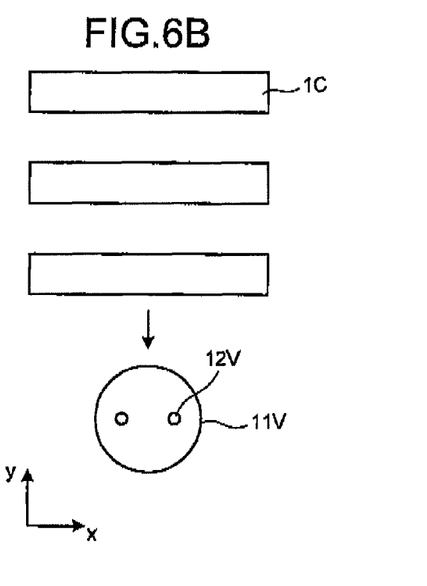

FIGS. 6A and 6B are diagrams for explaining a relation between arrangement directions of light sources of dipole lights and a pattern arrangement direction of the diffraction patterns. In FIGS. 6A and 6B, top views of the light sources and the diffraction patterns 1C are shown. Light sources of dipole lights arranged when the diffraction patterns 1C extend in an x-axis direction are explained.

When the overall exposure on a wafer is performed, the dipole light 11U in which two light sources 12U are arranged in a direction parallel to a y axis as shown in FIG. 6A can be used or the dipole light 11V in which two light sources 12V are arranged in a direction parallel to the x axis as shown in FIG. 6B can be used.

For example, when the resist patterns 3A to be ½ pitch patterns or ¼ pitch patterns of the diffraction patterns 1C are formed, the overall exposure is performed from above the diffraction patterns 1C by using the dipole light 11U. In other words, when the fine resist patterns 3A are formed, the overall exposure is performed by setting a direction in which the light sources 12U are arranged perpendicular to a direction in which the diffraction patterns 1C extend.

When the resist patterns 3A are formed not to form loop patterns, the overall exposure is performed from above the diffraction patterns 1C using the dipole light 11V. In other words, when pattern formation is performed in a desired position, the overall exposure is performed by setting the direction in which the diffraction patterns 1C extend parallel to a direction in which the light sources 12V are arranged.

Figure 7A:
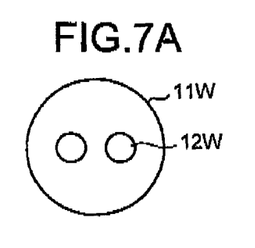
FIGS. 7A and 7B are diagrams for explaining light source sizes of dipole lights.
Figure 7B:
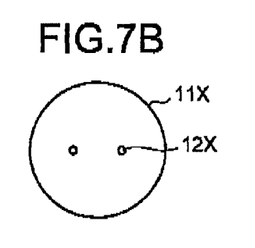

When the illumination light source shape of a dipole light is adjusted, not only arrangement positions of light sources but also the size of the light sources can be adjusted. FIGS. 7A and 7B are diagrams for explaining the sizes of light sources of dipole lights. In the following explanation, the size of the light sources 12R of the dipole light 11R is adjusted.

The dipole light 11W shown in FIG. 7A has light sources 12W obtained by increasing the light source size of the light sources 12R. The dipole light 11X shown in FIG. 7B has a light sources 12X obtained by reducing the light source size of the light sources 12R.

By using the dipole light 11W and the dipole light 11X, light intensity distributions different from the light intensity distributions formed when the dipole lights 11P to 11V are used are formed. When the illumination light source shape of a dipole light is adjusted by adjusting the size of light sources, the light sources are adjusted to size corresponding to the pattern shape of the resist patterns 3A desired to be formed.

The illuminating device is not limited to the dipole lights 11P to 11X and can be a four-eye light (a quadrupole light). FIGS. 8A to 8D are diagrams of examples of the configurations of four-eye lights. In FIGS. 8A to 8D, top views of the four-eye lights 13P to 13S are shown.

Figure 8A:
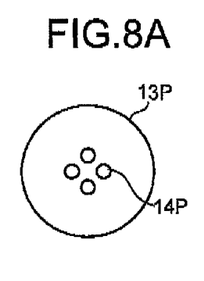
FIGS. 8A to 8D are diagrams of examples of the configurations of four-eye lights.
Figure 8B:
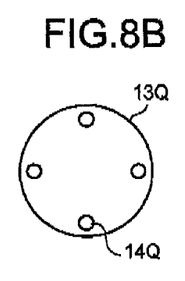
Figure 8C:
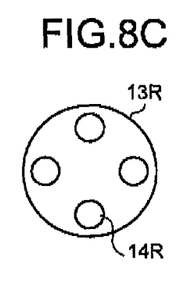
Figure 8D:
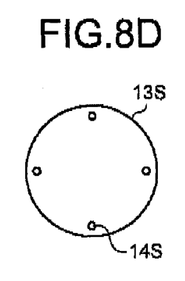

In FIG. 8A, the four-eye light 13P including light sources 14P arranged at a narrow space is shown. In FIG. 8B, the four-eye light 13Q including light sources 14Q arranged at a wide space is shown. In FIG. 8C, the four-eye light 13R including large-size light sources 14R is shown. In FIG. 8D, the four-eye light 13S including small-size light sources 14S is shown.

The illuminating device is not limited to the dipole lights 11P to 11X and the four-eye lights 13P to 13S and can be an orbicular zone light. FIGS. 9A to 9D are diagrams of examples of the configurations of orbicular zone lights. In FIGS. 9A to 9D, top views of the orbicular zone lights 15P to 15S are shown.

Figure 9A:
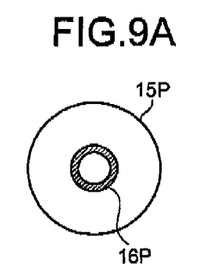
FIGS. 9A to 9D are diagrams of examples of the configurations of orbicular zone lights.
Figure 9B:
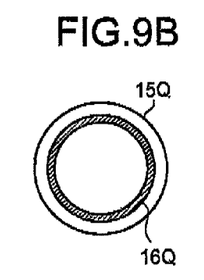
Figure 9C:
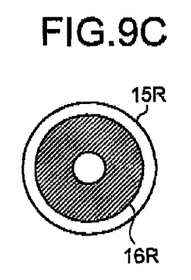
Figure 9D:
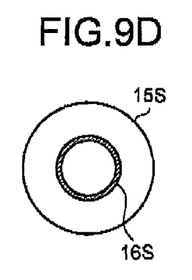

In FIG. 9A, the orbicular zone light 15P including light source 16P, an orbicular zone inner diameter of which is small, is shown. In FIG. 9B, the orbicular zone light 15Q including light source 16Q, an orbicular zone inner diameter of which is large, is shown. In FIG. 9C, the orbicular zone light 15R including light source 16R, orbicular zone width (difference between an inner diameter and an outer diameter) of which is large, is shown. In FIG. 9D, the orbicular zone light 15S including light source 16S, orbicular zone width of which is small, is shown.

Figure 10A:
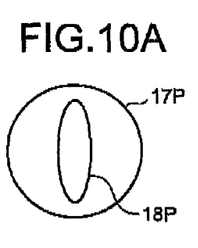
FIGS. 10A and 10B are diagrams of examples of the configurations of elliptical lights.
Figure 10B:
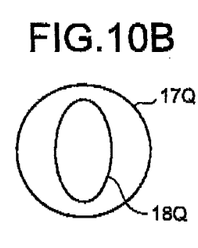

The illuminating device is not limited to the dipole lights 11P to 11X, the four-eye lights 13P to 13S, and the orbicular zone lights 15P to 15S and can be an elliptical light including elliptical light sources. FIGS. 10A and 10B are diagrams of examples of the configurations of elliptical lights. In FIGS. 10A and 10B, top views of elliptical lights 17P and 17Q are shown.

In FIG. 10A, the elliptical light 17P including light source 18P, a minor axis of an ellipse of which is short, is shown. In FIG. 10B, the elliptical light 17Q including light source 18Q, a minor axis of an ellipse of which is long, is shown.

For example, when the fine resist patterns 3A are formed, the overall exposure is performed to set the direction in which the diffraction patterns 1C extend as a minor axis of an ellipse.

When pattern formation is performed in a desired position, the overall exposure is performed to set the direction in which the diffraction patterns 1C extend is a major axis of an ellipse.

Figure 11A:
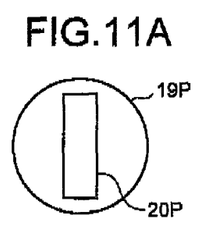
FIGS. 11A and 11B are diagrams of examples of the configurations of rectangular lights.
Figure 11B:
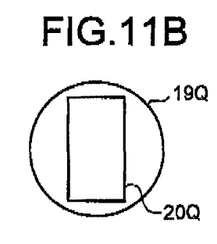

The illuminating device is not limited to the dipole lights 11P to 11X, the four-eye lights 13P to 13S, the orbicular zone lights 15P to 15S, and the elliptical lights 17P and 17Q and can be a rectangular light having rectangular light sources. FIGS. 11A and 11B are diagrams of examples of the configurations of rectangular lights. In FIGS. 11A and 11B, top views of rectangular lights 19P and 19Q are shown.

In FIG. 11A, the rectangular light 19P including light source 20P, a short side of a rectangle of which is short, is shown. In FIG. 11B, the rectangular light 19Q including light source 20Q, a short side of a rectangle of which is long, is shown.

For example, when the fine resist patterns 3A are formed, the overall exposure is performed to set the direction in which the diffraction patterns 1C extend as a short side of a rectangle. When pattern formation is performed in a desired position, the overall exposure is performed to set the direction in which the diffraction patterns IC extend as a long side of a rectangle.

In this embodiment, it is determined by using, for example, an illumination-light-source-shape calculating device 30 explained later with which of illuminating devices the overall exposure from above the diffraction patterns IC is performed. Illumination light source shape (the size, the arrangement, and the like of light sources) in the determined illuminating device is also determined.

Figure 12:
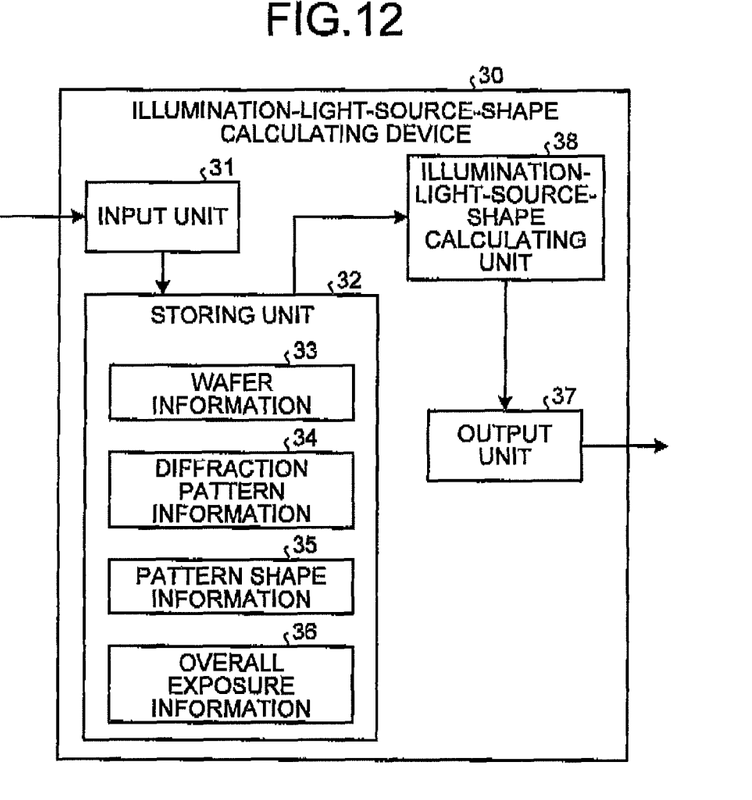
FIG. 12 is a block diagram of the configuration of an illumination-light-source-shape calculating device.

FIG. 12 is a block diagram of the configuration of an illumination-light-source-shape calculating device. The illumination-light-source-shape calculating device 30 is a computer or the like that derives illumination light source shape corresponding to patterns to be formed. The illumination-light-source-shape calculating device 30 derives a type and illumination light source shape of an illuminating device corresponding to pattern shape desired to be formed on a wafer.

The illumination-light-source-shape calculating device 30 includes an input unit 31, a storing unit 32, an illumination-light-source-shape calculating unit 38, and an output unit 37. The input unit 31 receives input of various kinds of information to be stored in the storing unit 32 and sends the information to the storing unit 32. The storing unit 32 is a memory or the like that stores, as the information sent from the input unit 31, wafer information 33, diffraction pattern information 34, pattern shape information 35, and overall exposure information 36.

The wafer information 33 is information concerning a wafer subjected to the overall exposure and is, for example, information concerning an arrangement position (a distance in a thickness direction from the diffraction patterns 1C). The diffraction pattern information 34 is information concerning the diffraction patterns 1C and is, for example, a layout, thickness, and the like of the diffraction patterns 1C. The pattern shape information 35 is information concerning the resist patterns 3A and is, for example, the pattern shape of the resist patterns 3A desired to be formed on the wafer. The overall exposure information 36 is information concerning conditions of the overall exposure and is, for example, a value of wavelength used for the overall exposure and an optical constant of an upper layer film at the wavelength.

The illumination-light-source-shape calculating unit 38 calculates, using the wafer information 33, the diffraction pattern information 34, the pattern shape information 35, the overall exposure information 36, and the like in the storing unit 32, an exposure light irradiation angle or the like for forming the resist patterns 3A in a desired pattern shape. The illumination-light-source-shape calculating unit 38 derives an illuminating device and illumination light source shape using the calculated exposure light irradiation angle or the like.

Specifically, the illumination-light-source-shape calculating unit 38 determines a type of an illuminating device for forming the desired resist patterns 3A and calculates the size, an arrangement position, and the like of an illumination light source as illumination light source shape for forming the desired resist patterns 3A. The illumination-light-source-shape calculating unit 38 calculates, using the wafer information 38, the diffraction pattern information 34, the pattern shape information 35, the overall exposure information 36, and the like, a light intensity distribution formed under the diffraction patterns 1C. The illumination-light-source-shape calculating unit 38 determines a type of an illuminating device and illumination light source shape to form the light intensity distribution as a light intensity distribution with which the desired resist patterns 3A can be formed.

For example, when an illuminating device used for the overall exposure is designated by a user, the illumination-light-source-shape calculating unit 38 derives illumination light source shape of the designated illuminating device. When an illuminating device used for the overall exposure is not designated by the user, the illumination-light-source-shape calculating unit 38 derives both a type of an illuminating device and illumination light source shape. The output unit 37 outputs the type of the illuminating device and the illumination light source shape derived by the illumination-light-source-shape calculating unit 38 to the outside.

The processing for calculating illumination light source shape and the like by the illumination-light-source-shape calculating unit 38 is performed, for example, for each layer in a wafer process. In each layer, exposure processing on a wafer is performed by using an exposure apparatus, the illumination light source shape of which is changed according to necessity. Specifically, the overall exposure is applied to the wafer from over the diffraction patterns 1C by the exposure apparatus, the illumination light source shape of which is changed. Thereafter, the post-etching patterns 4A are formed by development processing and etching processing. When a semiconductor device (a semiconductor integrated circuit) is manufactured, the processing for deriving an illuminating device and illumination light source shape, the exposure processing with the derived illuminating device and illumination light source shape, the development processing, the etching processing, and the like are repeated for each layer.

Figure 13:
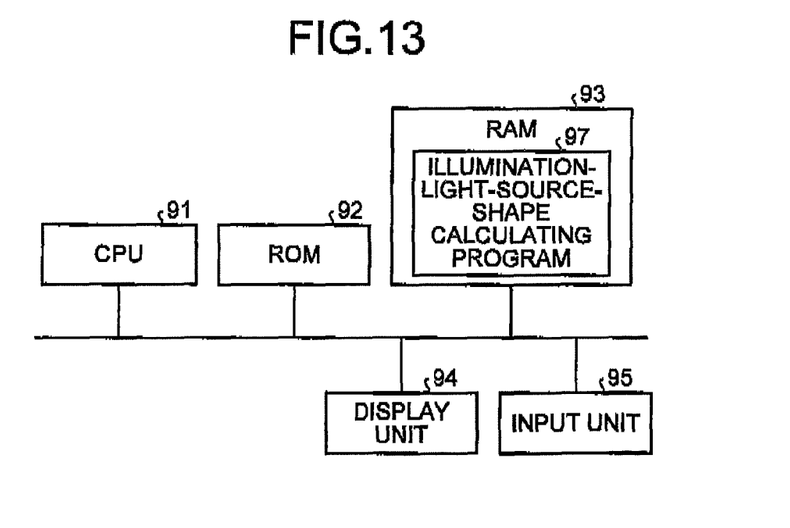
FIG. 13 is a diagram of a hardware configuration of the illumination-light-source-shape calculating device.

FIG. 13 is a diagram of a hardware configuration of the illumination-light-source-shape calculating device. The illumination-light-source-shape calculating device 30 includes a central processing unit (CPU) 91, a read only memory (ROM) 92, a random access memory (RAM) 93, a display unit 94, and an input unit 95. In the illumination-light-source-shape calculating device 30, the CPU 91, the ROM 92, the RAM 93, the display unit 94, and the input unit 95 are connected via a bus line.

The CPU 91 performs, for example, the processing for calculating an illumination light source shape using an illumination light source shape calculating program 97, which is a computer program. The display unit 94 is a display device such as a liquid crystal monitor. The display unit 94 displays, based on an instruction from the CPU 91, the wafer information 33, the diffraction pattern information 34, the pattern shape information 35, the overall exposure information 36, the calculated exposure light irradiation angle and light intensity distribution, the determined type of the illuminating device and illumination light source shape, and the like. The input unit 95 includes a mouse and a keyboard. The input unit 95 receives input of instruction information (parameters and the like necessary for the calculation of an exposure light irradiation angle, the calculation of a light intensity distribution, the calculation of an illumination shape, and the determination of a type of an illuminating device) externally input by the user. The instruction information input to the input unit 95 is sent to the CPU 91.

The illumination-light-source-shape calculating program 97 is stored in the ROM 92 and loaded into the RAM 93 via the bus line. In FIG. 13, a state in which the illumination-light-source-shape calculating program 97 is loaded into the RAM 93 is shown.

The CPU 91 executes the illumination-light-source-shape calculating program 97 loaded into the RAM 93. Specifically, in the illumination-light-source-shape calculating device 30, according to an instruction input from the input unit 95 by the user, the CPU 91 reads out the illumination-light-source-shape calculating program 97 from the ROM 92, expands the illumination-light-source-shape calculating program 97 in a program storage area in the RAM 93, and executes various kinds of processing. The CPU 91 causes the RAM 93 to temporarily store various data generated in the various kinds of processing in the storage area formed in the RAM 93.

The illumination-light-source-shape calculating program 97 executed by the illumination-light-source-shape calculating device 30 has a module configuration including the illumination-light-source-shape calculating unit 38. The illumination-light-source-shape calculating program 97 is loaded onto a main storage and the illumination-light-shape calculating unit 38 is generated on the main storage.

As explained above, according to the first embodiment, a type of an illuminating device and an illumination light source shape are determined such that the desired resist patterns 3A can be formed in the pattern formation by the overall exposure. Therefore, it is possible to form patterns of a pitch finer than the diffraction patterns 1C. It is possible to form patterns of a non-periodical layout, in which periodical arrangement of patterns is interrupted, together with the periodical patterns. Therefore, it is possible to easily form various fine and non-periodical patterns in the pattern formation by the overall exposure.

A second embodiment of the present invention is explained below with reference to FIGS. 14 to 17. In the second embodiment, blinds that irradiate exposure light only on a desired area are provided between an illumination optical system of an exposure apparatus that performs overall exposure and a wafer.

Figure 14:
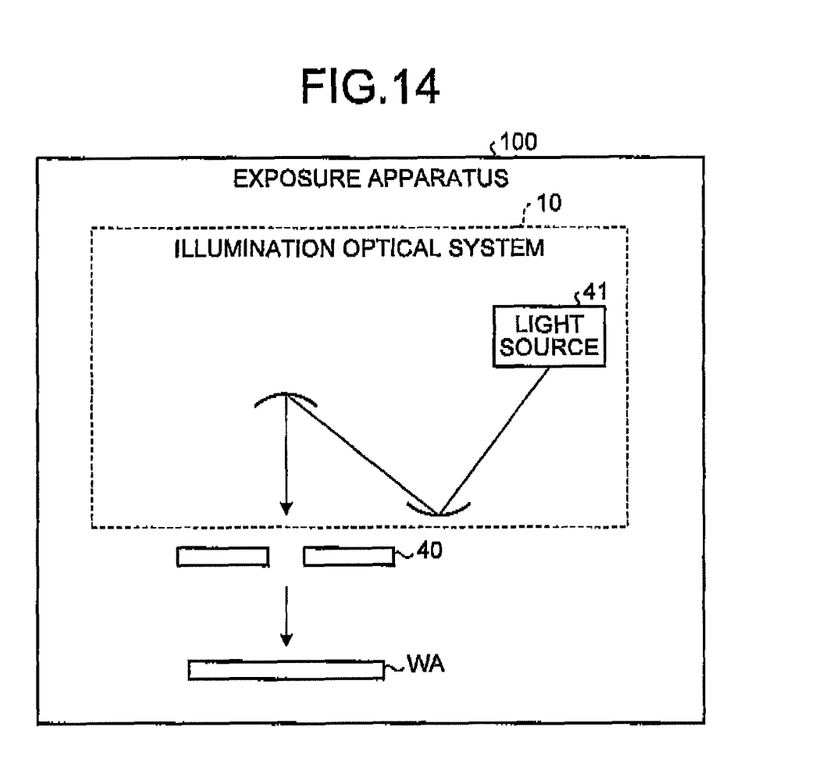
FIG. 14 is a diagram of the configuration of an exposure apparatus according to a second embodiment.

FIG. 14 is a diagram of the configuration of the exposure apparatus according to the second embodiment. An exposure apparatus 10 includes an illumination optical system 10 that irradiates exposure light on a wafer WA and blinds (light blocking units) 40 that irradiate the exposure light emitted from the illumination optical system 10 only on a desired area and blocking the exposure light to other areas. The illumination optical system 10 according to this embodiment has a function of performing the overall exposure from above the diffraction patterns 1C of the wafer WA without using a photomask.

The illumination optical system 10 according to this embodiment is configured to irradiate exposure light from a light source 41 on an overall exposure area (an exposure light irradiation area) (e.g., for several chips) on the wafer WA. An exposure apparatus 100 performs the irradiation of the exposure light on the exposure light irradiation area in various positions on the wafer WA to thereby irradiate the exposure light over substantially the entire surface of the wafer WA.

Figure 15:
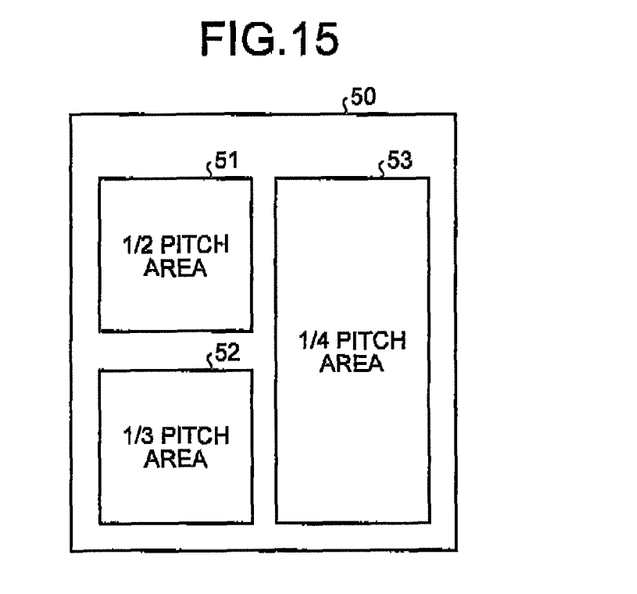
FIG. 15 is a diagram of an exposure light irradiation area by the exposure apparatus.

FIG. 15 is a diagram of the exposure light irradiation area by the exposure apparatus. An exposure light irradiation area 50 includes various pattern pitch areas such as a ½ pitch area 51, a ⅓ pitch area 52, and a ¼ pitch area 53. The ½ pitch area 51 is an area in which the resist patterns 3A are formed in lines and spaces having width ½ times as large as that of the diffraction patterns 1C (a pitch ½ times as large as that of the diffraction patterns 1C). The ⅓ pitch area 52 is an area in which the resist patterns 3A are formed in lines and spaces having width ⅓ times as large as that of the diffraction patterns 1C. The ¼ pitch area 53 is an area in which the resist patterns 3A are formed in lines and spaces having width ¼ times as large as that of the diffraction patterns 1C.

The exposure apparatus 100 includes the blind 40 that irradiates the exposure light only on, for example, the ½ pitch area 51, the blind 40 that irradiates the exposure light only on the ⅓ pitch area 52, and the blind 40 that irradiates the exposure light only on the ¼ pitch area 53.

Figure 16:
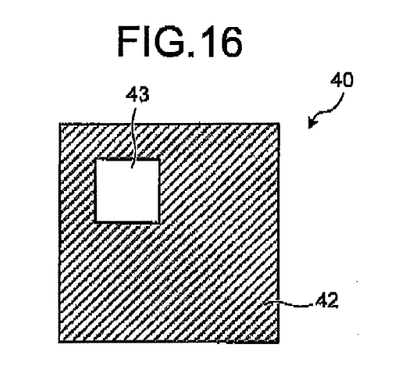
FIG. 16 is a diagram of an example of the configuration of a blind.

FIG. 16 is a diagram of an example of the configuration of the blind. In FIG. 16, a top view of the blind 40 is shown. The blind 40 has an opening 43 opened, to make it possible to irradiate the exposure light only on a predetermined area, only in an area on which the exposure light is irradiated. In other words, the blind 40 includes a ring-like blocking section 42 for blocking the exposure light besides the area on which the exposure light is irradiated. The opening 43 (an inner side area of the blocking section 42) is formed in shape and size corresponding to the ½ pitch area 51, the ⅓ pitch area 52, the ¼ pitch area 53, or the like. Consequently, the exposure light passed through the opening 41 is irradiated on the area (the ½ pitch area 51, the ½ pitch area 52, the ¼ pitch area 53, etc.) corresponding to the shape and the size of the opening 43.

Figure 17:
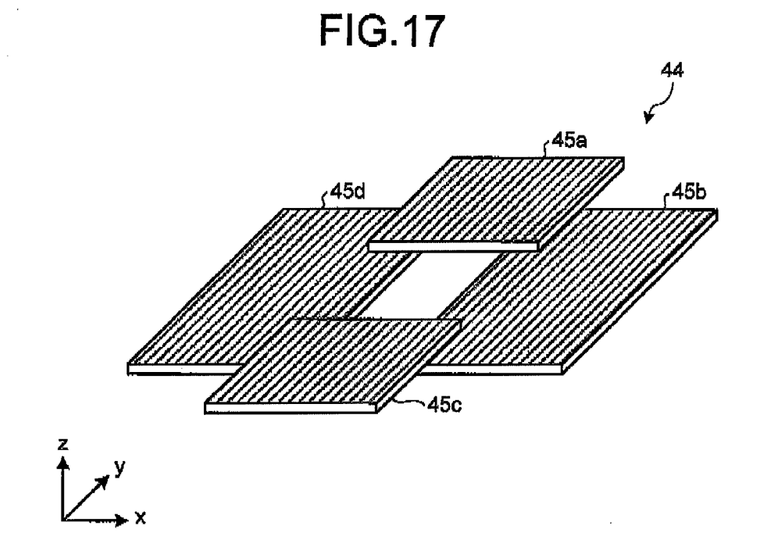
FIG. 17 is a diagram of another example of the configuration of the blind.

The blind 40 is not always formed of one tabular member shown in FIG. 16 and can be formed of a plurality of tabular members. FIG. 17 is a diagram of another example of the configuration of the blind. In FIG. 17, a perspective view of a blind 44 is shown. For convenience of explanation, it is assumed that the horizontal directions (directions parallel to the principal plane of the wafer WA) are xy directions and an irradiating direction of the exposure light (a direction perpendicular to the principal plane of the wafer WA) is a z direction.

The blind 44 includes tabular members (opening and closing units) 45a, 45b, 45c, and 45d that cause a part of the exposure light led from the light source 41 to pass to the wafer WA side. The opening and closing units 45a, 45b, 45c, and 45d are formed in a substantially rectangular plate shape parallel to an xy plane and can move in the x direction or the y direction. The blind 44 causes the exposure light to pass only to an inner side area surrounded by the opening and closing units 45a to 45d.

The opening and closing units 45a to 45d of the blind 44 according to this embodiment move in the xy plane to open only the area on which the exposure light is irradiated. For example, when the area on which the exposure light is irradiated is the ½ pitch area 51, the opening and closing units 45a to 45d move such that an opening formed by the opening and closing units 45a to 45d has shape and size corresponding to the ½ pitch area 51. In this way, the opening and closing units 45a to 45d cause the exposure light to pass to only a predetermined exposure area (the ½ pitch area 51, the ⅓ pitch area 52, the ¼ pitch area 53, etc.) on the wafer WA.

The area to which the blind 40 or 44 causes the exposure light to pass is not limited to a pattern pitch area such as the ½ pitch area 51, the ⅓ pitch area 52, or the ¼ pitch area 53 and can be a narrow area such as a line end.

Figure 18:
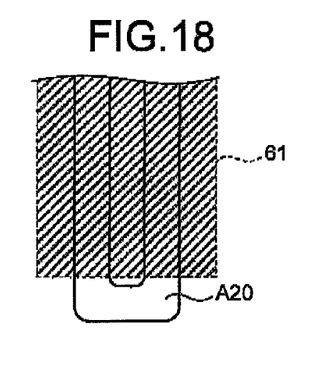
FIG. 18 is a diagram for explaining an exposure light blocking area in exposure of a loop pattern at a line end.

FIG. 18 is a diagram for explaining an exposure light blocking area in exposure of a loop pattern at a line end. When a loop pattern A20 is formed at a line end of the resist pattern 3A by the overall exposure from above the diffraction pattern 1C, an area other than the loop pattern A20 is shielded from the exposure light by a blind area 61, which is a part of the blind 40 or 44. Consequently, the exposure light is irradiated only on the loop pattern A20 to remove the loop pattern A20.

The irradiation of the exposure light on the loop pattern A20 can be performed at any timing as long as the irradiation is performed after the diffraction pattern 1C is removed. For example, the exposure light can be irradiated on the loop pattern A20 after the registration pattern 3A is formed. It is also possible to, after forming the post-etching pattern 4A with the resist pattern 3A as a mask, apply a resist on the post-etching pattern 4A and then irradiate the exposure light on the loop pattern A20.

The blind 40 or 44 is not limited to the irradiation of the exposure light only on the predetermined pattern pitch area such as the ½ pitch area 51 or the loop pattern A20. The blind 40 or 44 can irradiate the exposure light only on any area.

As explained above, according to the second embodiment, the exposure light of the overall exposure is irradiated only on the predetermined area by the blind 40 or 44 such that the desired resist patterns 3A can be formed. Therefore, it is possible to easily form various fine patterns.

According to the first and second embodiments explained above, it is possible to easily form various fine patterns.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposing method comprising:
   laminating, on a substrate, a resist layer on an upper side of a pattern formation layer on which a desired pattern is to be formed;
   forming, further on an upper side of the resist layer, a diffraction pattern configured to diffract exposure light irradiated on the substrate; and
   performing overall exposure without intervention of a photomask from above the diffraction pattern using a deformed light having illumination light source shape determined according to the desired pattern and irradiating, on the resist layer, diffracted light diffracted by the diffraction pattern,
   wherein the deformed light is a dipole light, and
   an illumination light source is arranged in a direction perpendicular to a pitch direction of the desired pattern.

2. A method of manufacturing a semiconductor device, comprising:
   laminating, on a substrate, a resist layer on an upper side of a pattern formation layer on which a desired pattern is to be formed;
   forming, further on an upper side of the resist layer, a diffraction pattern configured to diffract exposure light irradiated on the substrate;

performing overall exposure without intervention of a photomask from above the diffraction pattern using a deformed light having illumination light source shape determined according to the desired pattern and irradiating, on the resist layer, diffracted light diffracted by the diffraction pattern;

performing development on the resist layer to thereby form a resist pattern on the substrate; and processing the pattern formation layer with the resist pattern as a mask to thereby form the desired pattern, wherein the deformed light is a dipole light, and an illumination light source is arranged in a direction perpendicular to a pitch direction of the desired pattern.

* * * * *